United States Patent
Bushelman et al.

(10) Patent No.: US 9,862,808 B2
(45) Date of Patent: Jan. 9, 2018

(54) POLYAMIDE COMPOSITIONS FOR LED APPLICATIONS

(75) Inventors: Corinne Bushelman, Cumming, FL (US); Nancy J. Singletary, Alpharetta, GA (US); Glenn P. Desio, Marietta, GA (US)

(73) Assignee: SOLVAY SPECIALTY POLYMERS USA, LLC, Alpharetta, GA (US)

( * ) Notice: Subject to any disclaimer, the term of this patent is extended or adjusted under 35 U.S.C. 154(b) by 0 days.

(21) Appl. No.: 14/239,435

(22) PCT Filed: Aug. 16, 2012

(86) PCT No.: PCT/EP2012/066052
§ 371 (c)(1),
(2), (4) Date: Feb. 18, 2014

(87) PCT Pub. No.: WO2013/026779
PCT Pub. Date: Feb. 28, 2013

(65) Prior Publication Data
US 2014/0209969 A1    Jul. 31, 2014

Related U.S. Application Data

(60) Provisional application No. 61/525,478, filed on Aug. 19, 2011.

(30) Foreign Application Priority Data

Nov. 10, 2011    (EP) .................................. 11188645

(51) Int. Cl.
| | | |
|---|---|---|
| C08K 3/00 | (2006.01) | |
| C08K 3/22 | (2006.01) | |
| C08G 69/26 | (2006.01) | |
| C08L 77/06 | (2006.01) | |
| H01L 33/00 | (2010.01) | |
| H01L 33/56 | (2010.01) | |

(52) U.S. Cl.
CPC ............... C08K 3/22 (2013.01); C08G 69/26 (2013.01); C08L 77/06 (2013.01); H01L 33/00 (2013.01); H01L 33/56 (2013.01)

(58) Field of Classification Search
CPC combination set(s) only.
See application file for complete search history.

(56) References Cited

U.S. PATENT DOCUMENTS

| | | | |
|---|---|---|---|
| 6,521,689 B1 | 2/2003 | Yabuhara et al. | |
| 2002/0151625 A1* | 10/2002 | Yakabe et al. | ................ 524/127 |
| 2004/0252502 A1 | 12/2004 | McCullough et al. | |
| 2005/0245018 A1 | 11/2005 | Bogner et al. | |
| 2006/0292747 A1 | 12/2006 | Loh | |
| 2007/0189007 A1 | 8/2007 | Nishimoto et al. | |
| 2008/0044934 A1 | 2/2008 | Loh et al. | |
| 2008/0274355 A1 | 11/2008 | Hewel | |
| 2010/0117099 A1 | 5/2010 | Leung | |
| 2010/0261818 A1 | 10/2010 | Seki | |
| 2010/0270577 A1 | 10/2010 | Rulkens et al. | |
| 2012/0065327 A1* | 3/2012 | Ogawa et al. | ................ 524/606 |
| 2012/0170277 A1* | 7/2012 | Tamura | ................ C08G 69/265 |
| | | | 362/296.02 |

FOREIGN PATENT DOCUMENTS

| | | |
|---|---|---|
| EP | 1988113 A1 | 11/2008 |
| EP | 2305735 A1 | 4/2011 |
| JP | 2009007552 A | 1/2009 |
| WO | WO 03085029 A1 * | 10/2003 |
| WO | 2006135841 A1 | 12/2006 |
| WO | 2011010290 A1 | 1/2011 |
| WO | 2011027562 A1 | 3/2011 |

OTHER PUBLICATIONS

Kazmer, "Power Law Viscosity Fitting", UMass Lowell, (2013) (http://kazmer.uml.edu/Software/Power_law_fitter.htm).*
ASTM Designation: D3835—08, downloaded Aug. 31, 2016.*
Murphy J., in "Additives for Plastics Handbook", 2nd Edition, 2001, Chapter 5.2.3., p. 43-48—Elsevier Advanced Technology.
Standard ISO 11357-3, "Plastics—Differential scanning calorimetry (DSC)—Part 3: Determination of temperature and enthalpy of melting and crystallization—Second Edition", 2011, 10 pages.
Standard ASTM D3835-08, "Standard Test Method for Determination of Properties of Polymeric Materials by Means of a Capillary Rheometer", 2008, 11 pages.

(Continued)

*Primary Examiner* — Thomas L Dickey
(74) *Attorney, Agent, or Firm* — Jarrod N. Raphael; Nikhil Patel

(57) ABSTRACT

The invention relates to polyamide composition comprising at least one polyamide featuring a melting temperature (Tm), at least one metal oxide selected from magnesium oxide, zinc oxide and calcium oxide, and titanium dioxide, said composition featuring an intrinsic melt viscosity of below 800 Pa·s as measured according to ASTM D3835-08 at a moisture content as measured according to ASTM D6869-03 in the range of 150-500 ppm at a shear rate of 400 s$^{-1}$ and at a temperature ranging from [(Tm max)+10° C.] to [(Tm max)+20° C.] where (Tm max) is the highest of all melting temperatures (Tm). Invented compositions feature high reflectivity in the molded part with high retention of whiteness and reflectivity after heat aging. This unique combination of properties makes the compositions according to the invention most suitable for LED applications.

28 Claims, No Drawings

(56) References Cited

OTHER PUBLICATIONS

Standard ASTM D6869-03, "Standard Test Method for Coulometric and Volumetric Determination of Moisture in Plastics Using the Karl Fischer Reaction (the Reaction of Iodine with Water)", 2003, 4 pages.
Allen N.S., "Photofading and light stability of dyed and pigmented polymers", Polymer Degradation and Stability, 1994, vol. 44, Issue 3, pp. 357-374—Elsevier Science Limited.

* cited by examiner

POLYAMIDE COMPOSITIONS FOR LED APPLICATIONS

This application is a U.S. national stage entry under 35 U.S.C. §371 of International Application No. PCT/EP2012/066053, filed Aug. 16, 2012, which claims priority to U.S. provisional application No. 61/525,484 filed on Aug. 19, 2011 and to European application No. 11188646.1 filed on Nov. 10, 2011, the whole content of each of these applications being incorporated herein by reference for all purposes.

FIELD OF INVENTION

The invention relates to certain compositions featuring low intrinsic melt viscosities and comprising at least one polyamide, at least one metal oxide selected from magnesium oxide, zinc oxide and calcium oxide, and titanium dioxide.

The present invention further provides an article comprising the composition of the invention, such as light emitting diode (LED) devices.

BACKGROUND OF THE INVENTION

LED components, such as housings, reflectors and reflector plates require an especially demanding combination of excellent color and improved physical properties. Ceramics may be advantageously used in those applications, but are still extremely costly and require demanding processing technologies.

Therefore, polymer compositions have been extensively studied and developed to replace ceramics as a lower cost material. LED applications require polymer compositions with good opacity and outstanding reflective properties. Various useful polymer compositions for LED applications are known, these ones usually include polycondensation polymers, such as polyphthalamides. One problem noted with the prior art compositions used in LED applications is that they tend to yellow when exposed to light and heat.

LED components are exposed to elevated temperatures during the manufacturing process. For example, during the fabricating steps the LED components are heated to about 180° C. to cure an epoxy or silicon encapsulant. The LED components are also exposed to temperatures above 260° C. while soldering operations are performed. In addition, while in use, LED components, such as automobile components, are routinely subjected to temperatures above 80° C. This exposure to high temperatures causes yellowing of polymer compositions used for forming LED components.

Desirably, reflector plates of LEDs and, in fine, the polymer compositions from which they are made should comply with a wide set of requirements, including, notably, high reflectance of light (in general, of visible light), high whiteness, good processability (e.g. good moldability), high dimensional stability (notably low coefficient of linear expansion), high mechanical strength, high heat deflection temperature and high heat resistance (low discoloration and low loss of reflectance when exposed to a high temperature).

Deterioration of components of reflectors may cause the LED devices to suffer from light distortion and/or poor emission efficiency after exposure to high temperature and high intensity radiation.

Titanium dioxide ($TiO_2$) is extensively used in compositions used in LED applications as a white pigment. Such compositions exhibit superior properties for molding and the molded parts exhibit high thermal stability, including dimensional stability and retention of mechanical properties, during fabrication and end use. Retention of whiteness and reflectivity during processing and end use is also high. Typical compounds contain $TiO_2$, a reinforcing filler (glass fiber or mineral fillers) and organic stabilizers (hindered phenols, phosphites and hindered amines light stabilizers).

WO 2011/027562 discloses LED reflector plates made of a composition comprising a polymer obtained by the polycondensation of 1,4-cyclohexane dicarboxylic acid and an aliphatic diamine comprising from 4-18 C atoms, optionally a white pigment such as $TiO_2$, optionally glass fiber and/or wollastonite, optionally MgO or $Mg(OH)_2$. The compositions prepared according to the examples all comprise 1.9% of MgO.

One of ordinary skill in the art will recognize that further improvements in heat stability, molding performance and reflectivity are advantageous for the development of LED assemblies. The utility of LED lighting devices of increasing power and brightness in electronics, in signage, in automobiles and in residential and commercial lighting has driven manufacturing and end use criteria to include even higher initial and retained reflectivity.

The inventors have found out that the presence of metal oxides such as magnesium oxide, zinc oxide and calcium oxide is surprisingly only advantageous when used in combination with $TiO_2$ and with a polymer featuring a specific intrinsic melt viscosity at a specific moisture content.

The present invention provides a new solution to improved retention of reflectivity through the LED assembly manufacturing process (10 min at 260° C., 8 hours at 160° C.). The object of the invention is to provide a polyamide composition that offers high reflectivity in the molded part with high retention of whiteness and reflectivity after heat aging. The composition further provides improved retention of reflectivity after heat/light aging.

DETAILED DESCRIPTION

In a first aspect, the present invention relates to a composition featuring all the above advantages and having at least one melting temperature (Tm) as measured according to ISO 11357-3, said composition comprising:
 at least one polyamide;
 at least one metal oxide selected from magnesium oxide, zinc oxide and calcium oxide and mixtures thereof; and
 titanium dioxide;
wherein the composition has an intrinsic melt viscosity of below 800.0 Pa·s as measured according to ASTM D3835-08 at a moisture content as measured according to ASTM D6869-03 in the range of 150-500 ppm at a shear rate of 400 $s^{-1}$ and at a temperature ranging from [(Tm max)+10° C.] to [(Tm max)+20° C.], where (Tm max) is the highest of all melting temperatures.

The composition of the present invention provides improved retention of reflectivity through the LED assembly manufacturing process that offers high reflectivity in the molded part with high in-use retention of whiteness and reflectivity. The composition further provides high moldability, solder resistance, adhesion and mechanical properties, and finds advantageous application when used in emission apparatus, such as LED devices.

In a second aspect, the present invention provides an article, and in particular a LED, comprising at least one component comprising the polyamide composition according to the present invention.

In a third aspect, the present invention is related to the use of the composition according to the present invention in a light emission apparatus, and in particular a LED.

These and other features, aspects, and advantages of the present subject matter will become better understood with reference to the following description.

The Composition

The composition according to the present invention preferably has at least one melting temperature (Tm) as measured by DSC according to ISO 11357-3 of more than 200° C., more preferably more than 250° C., still more preferably more than 280° C. and most preferably more than 290° C. The melting temperature (Tm) of the composition according to the present invention is preferably of less than 340° C., more preferably less than 330° C., still more preferably less than 325° C. and most preferably less than 320° C.

The composition according to the present invention has an intrinsic melt viscosity as measured using the standard test method for determination of properties of polymeric materials by means of a capillary rheometer according to ASTM D 3835-08 of below 800.0, advantageously below 750.0, preferably below 700.0, more preferably below 650.0, even more preferably below 600.0 and most preferably below 550.0 Pa·s at a moisture content as measured using the standard test method for coulometric and volumetric determination of moisture in plastics using the Karl-Fisher reaction according to ASTM D6869-03 in the range of 150-500 ppm at a shear rate of 400 s$^{-1}$ and at a temperature ranging from [(Tm max)+10° C.] to [(Tm max)+20° C.], (Tm max) being the highest of all melting temperatures (Tm) of the composition according to the present invention, as measured by DSC according to ISO 11357-3.

Typically the composition according to the present invention has an intrinsic melt viscosity, as measured as described above, of at least 1 Pa·s, generally of at least 5 Pa·s, preferably at least 10 Pa·s.

The intrinsic melt viscosity of the composition according to the present invention was measured according to ASTM D 3835-08 method and using a capillary rheometer LCR7000 with the following testing conditions: the sample used had a weight of about 50 g; the die orifice length was of 15.240 mm±0.025 mm, and the die orifice diameter was of 1.016 mm±0.008 mm; the sample was preconditioned with a drying step of at least 24 hours at 80° C.; the melt time was of about 85 s.

When the compositions feature more than one melting temperature, as shown from the DSC measurements, the intrinsic melt viscosity measurements must be carried out at a temperature ranging from [(Tm max)+10° C.] to [(Tm max)+20° C.], where (Tm max) is the highest of all melting temperatures.

The moisture content of the compositions were measured following ASTM D6869-03 method and using about 0.5-0.7 g of the polyamide as a sample and an oven temperature of about 245° C. with a Mitsubishi CA/VA-100 moisture analyzer. The polyamide samples used for the determination of the intrinsic melt viscosity had a moisture content of no more than 500 ppm. Preferably the moisture content was in the range from 160 to 480 ppm.

The compositions of the present invention comprise different ingredients that are listed and detailed hereafter.

The Polyamide

The composition according to the present invention comprises at least one polyamide. The term "polyamide" is generally understood to indicate a polymer comprising recurring units deriving from the polycondensation reaction of at least one diamine and at least one dicarboxylic acid and/or from at least one amino carboxylic acid or lactam.

Suitable dicarboxylic acids can be aromatic or aliphatic. For the purpose of the present invention, the term "aromatic" when referred to a dicarboxylic acid or a diamine it means that said acid or diamine comprises one or more than one aromatic group.

Dicarboxylic acids derivatives, such as acid halogenides, especially chlorides, acid anhydrides, acid salts, acid amides and the like, can be advantageously used in the polycondensation reaction.

Non limitative examples of aromatic dicarboxylic acids are notably phthalic acids, including isophthalic acid (IA), terephthalic acid (TA) and orthophthalic acid (OA), naphtalenedicarboxylic acids (including 2,6-naphthalene dicarboxylic acid, 2,7-naphthalene dicarboxylic acid, 1,4-naphthalene dicarboxylic acid, 2,3-naphthalene dicarboxylic acid, 1,8-naphthalene dicarboxylic acid and 1,2-naphthalene dicarboxylic acid), 2,5-pyridinedicarboxylic acid, 2,4-pyridinedicarboxylic acid, 3,5-pyridinedicarboxylic acid, 2,2-bis(4-carboxyphenyl)propane, bis(4-carboxyphenyl)methane, 2,2-bis(4-carboxyphenyl)hexafluoropropane, 2,2-bis(4-carboxyphenyl)ketone, 4,4'-bis(4-carboxyphenyl)sulfone, 2,2-bis(3-carboxyphenyl)propane, bis(3-carboxyphenyl)methane, 2,2-bis(3-carboxyphenyl)hexafluoropropane, 2,2-bis(3-carboxyphenyl)ketone, bis(3-carboxyphenoxy)benzene.

Non limitative examples of aliphatic dicarboxylic acids are notably oxalic acid (HOOC—COOH), malonic acid (HOOC—CH$_2$—COOH), succinic acid [HOOC—(CH$_2$)$_2$—COOH], glutaric acid [HOOC—(CH$_2$)$_3$—COOH], 2,2-dimethyl-glutaric acid [HOOC—C(CH$_3$)$_2$—(CH$_2$)$_2$—COOH], adipic acid [HOOC—(CH$_2$)$_4$—COOH], 2,4,4-trimethyl-adipic acid [HOOC—CH(CH$_3$)—CH$_2$—C(CH$_3$)$_2$—CH$_2$—COOH], pimelic acid [HOOC—(CH$_2$)$_5$—COOH], suberic acid [HOOC—(CH$_2$)$_6$—COOH], azelaic acid [HOOC—(CH$_2$)$_7$—COOH], sebacic acid [HOOC—(CH$_2$)$_8$—COOH], undecanedioic acid [HOOC—(CH$_2$)$_9$—COOH], dodecandioic acid [HOOC—(CH$_2$)$_{10}$—COOH], tetradecandioic acid [HOOC—(CH$_2$)$_{11}$—COOH], cis and/or trans cyclohexane-1,4-dicarboxylic acid and cis and/or trans cyclohexane-1,3-dicarboxylic acid.

According to preferred embodiments of the present invention, the polyamide of the composition according to the present invention comprises advantageously recurring units deriving from at least one dicarboxylic acid selected from the group consisting of phthalic acids, e.g. isophthalic acid (IA), terephthalic acid (TA), orthophthalic acid (OA), adipic acid, naphtalenedicarboxylic acids, sebacic acid, and azelaic acid, while phthalic acids are preferred. One or more than one of said phthalic acid can be used. The phthalic acid is preferably terephthalic acid, optionally in combination with isophthalic acid.

Suitable diamines for the polyamide of the composition according to the present invention can be aromatic or aliphatic.

Suitable aliphatic diamines are typically aliphatic alkylene diamines having 2 to 18 carbon atoms. Said aliphatic alkylene diamine is advantageously selected from the group consisting of 1,2-diaminoethane, 1,2-diaminopropane, propylene-1,3-diamine, 1,3-diaminobutane, 1,4-diaminobutane, 1,5-diaminopentane, 1,4-diamino-1,1-dimethylbutane, 1,4-diamino-1-ethylbutane, 1,4-diamino-1,2-dimethylbutane, 1,4-diamino-1,3-dimethylbutane, 1,4-diamino-1,4-dimethylbutane, 1,4-diamino-2,3-dimethylbutane, 1,2-diamino-1-butylethane, 1,6-diaminohexane, 1,7-diaminoheptane, 1,8-diamino-octane, 1,6-diamino-2,5-dimethylhexane, 1,6-diamino-2,4-dimethylhexane, 1,6-diamino-3,3-dimethylhexane, 1,6-diamino-2,2-dimethylhexane, 1,9-diaminononane, 2-methylpentamethylenediamine, 1,6-diamino-2,2,4-trimethylhexane, 1,6-diamino-2,4,4-trimethylhexane, 1,7-diamino-2,3-dimethylheptane, 1,7-diamino-2,4-dimethylheptane, 1,7-diamino-2,5-dimethylheptane, 1,7-diamino-2,2-dimethylheptane, 1,10-diaminodecane, 1,8-diamino-1,3-dimethyloctane, 1,8-diamino-1,4-dimethyloctane, 1,8-diamino-2,4-dimethyloctane, 1,8-diamino-3,4-dimethyloctane, 1,8-diamino-4,5-dimethyloctane, 1,8-diamino-2,2-dimethyloctane, 1,8-diamino-3,3-dimethyloctane, 1,8-diamino-4,4-dimethyloctane, 1,6-diamino-2,4-diethylhexane, 1,9-diamino-5-methylnonane, 1,10-diaminodecane, 1,11-diaminoundecane, 1,12-diaminododecane, 1,3-diaminocyclohexane, 1,4-diaminocyclohexane, 1,3-bis(aminomethyl)cyclohexane, 1,4-bis(aminomethyl)cyclohexane, bis(3-methyl-4-aminocyclohexyl)-methane, 4,4'-methylene-bis-cyclohexylamine, isophoronediamine.

Non-limitative examples of suitable aromatic diamines are notably diamines selected from the group consisting of meta-phenylene diamine, meta-xylylene diamine and para-xylylene diamine.

According to preferred embodiments of the present invention, the polyamide of the composition according to the present invention comprises advantageously recurring units deriving from at least one diamine selected from the group consisting of 1,6-diaminohexane, 1,8-diamino-octane, 1,9-diaminononane, 1,10-diaminodecane, 1,11-diaminoundecane, 1,12-diaminododecane, meta-xylylene diamine. More preferably, the diamine is selected from the group consisting of 1,6-diaminohexane, 1,9-diaminononane, 1,10-diaminodecane, meta-xylylene diamine.

In a preferred embodiment, the polyamide of the composition according to the present invention is formed by reacting a mixture comprising less than 20 mol. % of adipic acid, based on the total amount of dicarboxylic acid. Preferably, it is formed by reacting a mixture comprising less than 10 mol. %, more preferably less than 5 mol. % of adipic acid, based on the total amount of dicarboxylic acid. Most preferably, it is formed by reacting a mixture essentially free or even completely free of adipic acid.

The polyamide of the composition according to the present invention may also be endcapped by any end capping agent. The term "end capping agent" indicates one or more compound which reacts with the ends of a polycondensate, capping the ends and limiting polymer molecular weight. The end capping agent is typically selected from the group consisting of an acid comprising only one reactive carboxylic acid group [acid (MA)] and an amine comprising only one reactive amine group [amine (MN)], and mixtures thereof. The expression 'acid/amine comprising only one reactive carboxylic acid/amine group' is intended to encompass not only mono-carboxylic acids or mono-amines but also acids comprising more than one carboxylic acid group or derivative thereof and amines comprising more than one amine or derivative thereof, but wherein only one of said carboxylic acid/amine group has reactivity with the polycondensate obtained from the polycondensation of the above mentioned diamine(s) and diacid(s). The expression 'derivative thereof' when used in combination with the expression 'carboxylic acid' or 'amine' is intended to denote whatever derivative thereof which is susceptible of reacting in polycondensation conditions to yield an amide bond.

Among suitable [acids (MA)] mention can be notably made of acetic acid, propionic acid, butyric acid, valeric acid, caproic acid, caprylic acid, lauric acid, stearic acid, cyclohexanecarboxylic acid and benzoic acid. [Acid (MA)] is preferably selected from acetic acid, benzoic acid and mixture thereof.

Among suitable [amines (MN)] mention can be notably made of methylamine, ethylamine, butylamine, octylamine, aniline, toluidine, propylamine, hexylamine, dimethylamine and cyclohexylamine.

The end-capping agent is generally used in an amount of more than 0.1 mol %, preferably more than 0.5 mol %, still more preferably more than 0.8 mol %, even more preferably more than 1 mol %, based on the total number of moles of the dicarboxylic acids, if [acids (MA)] are used as end-capping agent or based on the total number of the diamines, if [amines (MN)] are used as end-capping agent. The end-capping agent is generally used in an amount of less than 6.5 mol %, preferably less than 6.2 mol %, still more preferably less than 6 mol %, even more preferably less than 5.5 mol %, based on the total number of moles of the dicarboxylic acids, if [acids (MA)] are used as end-capping agent or based on the total number of the diamines, if [amines (MN)] are used as end-capping agent.

Non limitative examples of polyamides suitable for the composition according to the present invention are: the polymer of terephthalic acid with 1,9-nonamethylenediamine (PA9T), the polymer of terephthalic acid with 1,10-diaminodecane (PA10T), the polymer of terephthalic acid with 1,11-diaminoundecane (PA11T), the polymer of terephthalic acid with 1,12-diaminododecane (PA12T), the copolymer of terephthalic acid and isophthalic acid with hexamethylenediamine (PA6T/6I), the copolymer of terephthalic acid with hexamethylenediamine and 1,10-diaminodecane (PA6T/10T), the copolymer of terephthalic acid and isophthalic acid with hexamethylenediamine and 1,10-diaminodecane (PA6T/6I/10T/10I), the polyamide of para-xylylenediamine with adipic acid (PXD6), the copolymer of adipic acid with para- and meta-xylylenediamine; the copolymer of terephthalic acid with hexamethylenediamine and 1,4-bis(aminomethyl)cyclohexane; the copolymer of terephthalic acid with hexamethylenediamine and 1,3-bis(aminomethyl)cyclohexane; the copolymer of hexamethylenediamine with terephthalic acid and 2,6-napthalenedicarboxylic acid, the copolymer of hexamethylenediamine with terephthalic acid and sebacic acid, the copolymer of hexamethylenediamine with terephthalic acid, isophthalic acid and 1,4-cyclohexanedicarboxylic acid, the copolymer of 1,10-diaminodecane with terephthalic acid and 4-aminocyclohexanecarboxylic acid, the copolymer of 1,10-diaminodecane with terephthalic acid and 4-(aminomethyl)-cyclohexanecarboxylic acid, the polymer of 1,10-diaminodecane with 2,6-napthalenedicarboxylic acid, the copolymer of 2,6-napthalenedicarboxylic acid with hexamethylenediamine and 1,10-diaminodecane, the copolymer of 2,6-napthalenedicarboxylic acid with hexamethylenediamine and 1,10-diaminodecane, the polymer of 1,10-diaminodecane with 1,4-cyclohexanedicarboxylic acid, the copolymer of terephthalic acid with hexamethylenediamine and 2-methylpentamethylenediamine, the copolymer of terephthalic acid with 1,10-diaminodecane and 2-methylpentamethylenediamine, the copolymer of 2,6-napthalenedicarboxylic with hexamethylenediamine and 2-methylpentamethylenediamine, the copolymer of 1,4-cyclohexanedicarboxylic acid with 1,10-diaminodecane and 2-methylpentamethylenediamine.

The polyamide suitable for the composition according to the present invention preferably comprises:
  recurring units formed by the polycondensation reaction between terephthalic acid and 1,10-diaminodecane, or;
  recurring units formed by the polycondensation reaction between terephthalic acid and 1,6-hexamethylenediamine, or;

recurring units formed by the polycondensation reaction between terephthalic acid, 1,6-hexamethylenediamine and 1,10-diaminodecane.

Polyamide suitable for the composition according to the present invention preferably have at least one melting temperature as measured by DSC according to ISO 11357-3 2011 May 1) of more than 200° C., more preferably more than 250° C., still more preferably more than 280° C. and most preferably more than 290° C. The melting temperature of the polyamide of the composition according to the present invention is preferably of less than 340° C., more preferably less than 330° C., still more preferably less than 325° C. and most preferably less than 320° C.

More than one polyamide may be used in the composition in accordance with the invention.

The weight percent of the polyamide(s) in the total weight of the composition is generally of at least 30 wt. %, preferably of at least 40 wt. %, and more preferably of at least 50 wt. %. Besides, the weight percent of the polyamide (s) in the total weight of the polymer composition is generally of at most 90 wt. %, preferably of at most 80 wt. % and most preferably of at most 60 wt. %.

Excellent results were obtained when the polyamide was used in an amount of 40-70 wt. %, preferably of 50-60 wt. %, based on the total weight of the composition.

The Metal Oxide

The metal oxide used in the composition according to the present invention is selected from magnesium oxide, zinc oxide, calcium oxide and mixtures thereof. Preferably, it is magnesium oxide.

The metal oxide is preferably particulate.

Dead burned or hard burned metal oxides (i.e. those submitted to calcination treatment with temperatures exceeding 1000° C.) are preferably avoided.

The weight percent of the metal oxide in the total weight of the composition is generally of at least 1 wt. %, preferably of at least 2 wt. %, more preferably of at least 3 wt. %, even more preferably of at least 4 wt. %, still more preferably of at least 4.5 wt. % and most preferably of at least 5 wt. %. Besides, the weight percent of the metal oxide in the total weight of the polymer composition is generally of at most 8 wt. %, preferably of at most 7 wt. % and most preferably of at most 6 wt. %.

Excellent results were obtained when the metal oxide was used in an amount of 1-8 wt. %, preferably of 3-7 wt. %, more preferably 3.5-6.5 wt. %, most preferably 4-6 wt. %, based on the total weight of the composition.

The Titanium Dioxide

Titanium dioxide ($TiO_2$) is typically used in polyamide compositions as white pigment. The titanium dioxide of the composition according to the present invention is advantageously in the form of particles having a weight-average size (equivalent diameter) preferably of below 5 μm. Larger sizes may deleteriously affect the properties of the composition. Preferably, the weight-average size of the particles is of below 1 μm. Besides, it is preferably above 0.1 μm.

The shape of the particles is not particularly limited; they may be notably round, flaky, flat and so on.

The form of titanium dioxide is not particularly limited, and a variety of crystalline forms such as the anatase form, the rutile form and the monoclinic type can be used. However, the rutile form is preferred due its higher refraction index and its superior light stability. Titanium dioxide may be treated or not with a surface treatment agent. Preferably the average particle size of the titanium oxide is in the range of 0.15 μm to 0.35 μm.

The weight percent of the titanium dioxide in the total weight of the composition is generally of at least 1 wt. %, preferably of at least 6 wt. %, more preferably of at least 8 wt. % and most preferably of at least 15 wt. %. Besides, the weight percent of the titanium dioxide in the total weight of the polymer composition generally of at most 50 wt. %, preferably of at most 40 wt. %, more preferably of at most 30 wt. % and most preferably of at most 35 wt. %.

Excellent results were obtained when titanium dioxide was used in an amount of 10-30 wt. %, preferably of 15-25 wt. %, based on the total weight of the composition.

The Reinforcing Filler

Reinforcing fillers are well known by the skilled in the art and may be added to the composition in accordance with the present invention. They are preferably selected from fibrous and particulate fillers different from the metal oxides and titanium dioxide as defined above. More preferably, the reinforcing filler is selected from mineral fillers (such as talc, mica, kaolin, calcium carbonate, calcium silicate, magnesium carbonate), glass fiber, carbon fibers, synthetic polymeric fiber, aramid fiber, aluminum fiber, titanium fiber, magnesium fiber, boron carbide fibers, rock wool fiber, steel fiber, wollastonite etc. Still more preferably, it is selected from mica, kaolin, calcium silicate, magnesium carbonate, glass fiber and wollastonite etc.

A particular class of fibrous fillers consists of whiskers, i.e. single crystal fibers made from various raw materials, such as $Al_2O_3$, SiC, BC, Fe and Ni. Among fibrous fillers, glass fibers are preferred; they include chopped strand A-, E-, C-, D-, S- and R-glass fibers, as described in chapter 5.2.3, p. 43-48 of Additives for Plastics Handbook, 2nd edition, John Murphy. Preferably, the filler is chosen from fibrous fillers.

In a preferred embodiment of the present invention the reinforcing filler is chosen from wollastonite and glass fiber. Excellent results were obtained when wollastonite and/or glass fibers were used. Glass fibers may have a round cross-section or a non-circular cross-section.

The weight percent of the reinforcing filler in the total weight of the composition according to the present invention is generally of at least 5 wt. %, preferably of at least 10 wt. %, more preferably of at least 15 wt. % and most preferably of at least 20 wt. %. Besides, the weight percent of the reinforcing filler in the total weight of the polymer composition is generally of at most 50 wt. %, preferably of at most 40 wt. % and most preferably of at most 30 wt. %.

Excellent results were obtained when the reinforcing filler was used in an amount of 10-40 wt. %, preferably of 20-30 wt. %, based on the total weight of the composition.

Other Optional Ingredients

The composition in accordance with the invention can optionally comprise additional components such as stabilizing additive, notably mold release agents, plasticizers, lubricants, thermal stabilizers, light stabilizers and antioxidants etc.

The composition in another preferred embodiment further comprises at least a stabilizing additive. The stabilizing additive may be present in an amount of 1 to 10 wt. %.

The levels of these optional additives will be determined for the particular use envisioned, with generally up to 20 wt. %, preferably up to 10 wt. %, more preferably up to 5 wt. % and still more preferably up to 2 wt. % (based on the total weight of the polymer composition) of such additional additives considered to be within the range of ordinary practice in the extrusion art.

Certain stabilizers such as hindered amine light stabilizers (HALS) may be present in the composition. For example one or more of the group of hindered amines selected from the group bis(2,2,6,6-tetramethylpiperidin-4-yl)sebacate, bis(1,2,2,6,6-pentamethyl piperidin-4-yl)sebacate, di(1,2,2,6,6-pentamethylpiperidin-4-yl) (3,5-di-tert-butyl-4-hydroxybenzyl)butylmalonate, the polycondensation product of 1-(2-hydroxyethyl)-2,2,6,6-tetramethyl-4-hydroxypiperidine and succinic acid, the polycondensation product of 2,4-dichloro-6-tert-octylamino-s-triazine and 4,4'-hexamethylenebis(amino-2,2,6,6-tetramethylpiperidine), N,N',N'',N'''-tetrakis[(4,6-bis(butyl-(1,2,2,6,6-pentamethylpiperidin-4-y-1)amino)-s-triazine-2-yl]-1, 10-diamino-4,7-diazadecane, di-(1-octyloxy-2,2,6,6-tetramethylpiperidin-4-yl)sebacate, di-(1-cyclohexyloxy-2,2,6,6-tetramethylpiperidin-4-yl)succinate, 1-octyloxy-2,2,6,6-tetramethyl-4-hydroxypiperidine, poly-{[6-tert-octylamino-s-triazin-2,4-diyl][2-(1-cyclohexyloxy-2,2,6,6-tetramethylpiperidin-4-yl)imino-hexamethylene-[4-(1-cyclohexyloxy-2,2,6,6-tetramethylpiperidin-4-yl)imino], or 2,4,6-tris[N-(1-cyclohexyloxy-2,2,6,6-tetramethylpiperidin-4-yl)-n-butylamino]-s-triazine may be present in the composition according to the present invention.

The composition can additionally contain one or more UV absorbers selected from the group consisting of s-triazines, oxanilides, hydroxybenzophenones, benzoates and α-cyanoacrylates.

Thermal stabilizers may also be included in the composition. The thermal stabilizers commonly used in polyamide compositions are well known in the art. They can typically be one or more selected from, 3,9-bis[1,1-dimethyl-2-[(3-tert-butyl-4-hydroxy-5-methylphenyl)propionyloxy]ethyl]-2,4,8,10-tetraoxaspiro[5.5]undecane, pentaerythritol tetrakis (3-(3,5-di-tert-butyl-4-hydroxyphenyl)propionate), 3,3'-bis(3,5-di-tert-butyl-4-hydroxyphenyl)-N,N'-hexamethylenedipropionamide, 1,3,5-tris(3,5-di-(tert)-butyl-4-hydroxybenzyl)-1,3,5-triazine-2,4,6(1H,3H,5H)-trione, 1,3,5-triazine-2,4,6(1H,3H,5H)-trione,1,3,5-tris[[4-(1,1-dimethylethyl)-3-hydroxy-2,6-dimethylphenyl]methyl], benzenepropanoic acid,3-(1,1-dimethylethyl)-b[3-(1,1-dimethylethyl)-4-hydroxyphenyl]-4-hydroxy-b-methyl-, 1,1'-(1,2-ethanediyl)ester, bis(1,2,2,6,6-pentamethyl-4-piperidyl) [[3,5-bis(1,1-dimethylethyl)-4-hydroxyphenyl]methyl]butylmalonate, 2-(4,6-diphenyl-1,3,5-triazin-2-yl-)-5-((hexyl)oxyl-phenol, 2,4,8,10-tetraoxa-3,9-diphodphaspiro[5,5]undecane,3,9-bis[2,6-bis-1,1-dimethylethyl]-4-methylphenoxy], 12H dibenzo[d,g][1,3,2] dioxaphosphocin,2,4,8,10-tetrakis(1,1-dimethylethyl)-6-[(2-ethylhexyl)oxy], 2,4,8,10-tetraoxa-3,9-diphosphaspiro [5.5]undecane,3,9-bis[2,4-bis(1-methyl-1-phenylethyl) phenoxy], tris(2,4-di-(tert)-butylphenyl)phosphate, bis-2,4-di-tert-butylphenyl)pentaerythritol diphosphite, 2,4,8,10-tetraoxa-3,9-diphosphaspiro[5.5]undecane,3,9-bis (octadecyloxy), 2,4,8,10-tetraoxa-3,9-diphosphaspiro[5.5] undecane,3,9-bis[2,4-bis(1-methyl-1-phenylethyl) phenoxy], 2-(tert-Butyl)-6-methyl-4-(3-((2,4,8,10-tetrakis (tert-butyl)dibenzo[d,f][1,3,2]dioxaphosphepin-6-yl)oxy) propyl)phenol and bis[4-(2-phenyl-2-propyl)phenyl]amine.

In a particular embodiment the composition does not contain any hindered amine light stabilizer, does not contain any thermal stabilizer, or does not contain any of a hindered amine light stabilizer and a thermal stabilizer.

The Article

An aspect of the present invention also provides an article comprising at least one component comprising the polyamide composition of the present invention, which provides various advantages over prior art parts and articles, in particular an increased resistance to concurrent exposure to heat and UV rays while maintaining all their other properties at a high level. Preferably, the article or part of the article consists of the polymer composition.

In a particular embodiment, the article is a light emission apparatus.

Non limitative examples of light emission apparatuses are keyless entry systems of an automobile, lightings in a refrigerator, liquid crystal display apparatuses, automobile front panel lighting apparatuses, desk lamps, headlights, household electrical appliance indicators and outdoor display apparatuses such as traffic signs, and optoelectronic devices comprising at least one semi-conductor chip that emits and/or transmits electromagnetic radiation commonly known as Light Emitting Diodes devices (LEDs). Preferably, the light emission apparatus is a LED.

LEDs are preferably chosen from the group of top view LEDs, side view LEDs and power LEDs. Top view and side view LEDs comprise usually a basic housing, which, in general, acts as a reflector; besides, top view and side view LEDs usually do not comprise any heatsink slug. On the other hand, power LEDs comprise usually a heatsink slug, which, in general, acts as reflector; power LEDs usually further comprise a basic housing, which is a part distinct from the heatsink slug.

The top view LEDs are notably used in automotive lighting applications such as instrumental panel displays, stop lights and turn signals. The side view LEDs are notably used for mobile appliance applications such as, for example, cell phones and PDAs. The power LEDs are notably used in flashlights, automotive day light running lights, signs and as backlight for LCD displays and TVs.

The LED according to the present invention comprises at least one part comprising the polymer composition as above described. The part is preferably chosen from basic housings and heatsink slugs. The part acts usually as a reflector.

Preferably at least 50 wt. % and more preferably more than 80 wt. % of the part comprises the polymer composition (the part can possibly further contain notably a metal; for example, for certain end uses, the surface of the part acting as reflector may be metal plated). More preferably, more than 90 wt. % of the part comprises the polymer composition. Still more preferably, the part consists essentially of the polymer composition. The most preferably, the part consists of the polymer composition.

EXAMPLES

The following commercially available resins were used:
PA9T: Genestar PA9T, grade GC 61210, is a commercial resin produced by Kuraray Co. Ltd, exhibiting a double melting temperature of 295° C. and 307° C.
PA10T (1): Vicnyl 700 PA10T is a commercial resin produced by Kingfa Sci. & Tech. Co. Ltd, exhibiting a melting temperature of 316° C.

The other resins were prepared as detailed below using commercially available monomers and their melting temperatures were measured according to ISO 11357-3 as detailed below.

Preparation of the Polyamide Used in Composition E3, PA10T (2):

A stirred batch vessel was charged with 90,605 g distilled water, a diamine component consisting of 57,587 g 1,10-decanediamine (331.2 mol) and with a dicarboxylic acid component consisting of 51,700 g of terephthalic acid (311.2 mol). The reactor was also charged with 133.4 g sodium hypophosphite and 2,149 g benzoic acid (17.6 mol). A salt solution was obtained by heating the above described mixture at 145° C. The contents were pumped continuously to a reactor zone maintained at about 180 psig and 216° C., then to a zone maintained at about 298° C. and 1800 psig, then through a tubular reactor at 100 psig and heated with oil at 349° C. and into a vented Werner and Pfleiderer Corporation ZSK-30® twin-screw extruder equipped with a forward vacuum vent. Die temperature was set at 336° C. The finished polymer was extruded through a strand die into a water bath at a through-put rate of about 5.5-6.5 kg/hr and then chopped into pellets. The melting temperature of the obtained polyamide, measured by DSC, was 318° C.

Preparation of the Polyamide Used in Composition E4, PA10T/11 with Repeat Unit Mole Ratio of Decamethylene Terephthalamide and Undecanamide of 90:10

Polyamide component in E4 was produced according to the procedure described above but using the ingredients in the following quantities: 25,930 g 1,10-diaminodecane, 23,258 g terephthalic acid, 6,442 g 11-aminoundecanoic acid, 977 g benzoic acid, 68.1 g sodium hypophosphite and 46,278 g distilled water. The product resin exhibited a melting temperature of 292° C.

Preparation of the Polyamide Used in Composition E5, PA10T/6T with Repeat Unit Mole Ratio of Decamethylene Terephthalamide and Hexamethylene Terephthalamide of 85:15

Polyamide component in E5 was produced according to the procedure described above but using the ingredients in the following quantities: 3,533 g hexamethylenediamine, 23,434 g 1,10-diaminodecane, 25,850 g terephthalic acid, 1,075 g benzoic acid, 64.5 g sodium hypophosphite and 44,273 g distilled water. The product resin exhibited a melting temperature of 295° C.

Preparation of the Polyamide Used in Composition E6, PA10T/6T with Repeat Unit Mole Ratio of Decamethylene Terephthalamide and Hexamethylene Terephthalamide of 50:50

Polyamide component in E6 was produced according to the procedure described above but using the ingredients in the following quantities: 10,412 g hexamethylenediamine, 13,785 g 1,10-diaminodecane, 25,850 g terephthalic acid, 1,075 g benzoic acid, 58.7.5 g sodium hypophosphite, 93.7 g sodium phenylphosphinate and 42,057 g distilled water. The product resin exhibited a melting temperature of 316° C.

Preparation of the Polyamide Used in Composition E7, PA10T/10NDA with Repeat Unit Mole Ratio of Decamethylene Terephthalamide and Decamethylene Naphthalamide of 90:10

Polyamide component in E7 was produced according to the procedure described above but using the ingredients in the following quantities: 10,412 g hexamethylenediamine, 13,785 g 1,10-diaminodecane, 25,850 g terephthalic acid, 1,075 g benzoic acid, 58.7.5 g sodium hypophosphite, 93.7 g sodium phenylphosphinate and 42,057 g distilled water. The product resin exhibited a double melting temperature of 297° C. and 308° C.

Preparation of the Polyamide Used in Compositions E8 and E9, PA6T/6I with Repeat Unit Mole Ratio of Hexamethylene Terephthalamide and Hexamethylene Isophthalamide of 70:30

Polyamide component in E8 and E9 was produced according to the procedure described above but using the ingredients in the following quantities: 31.5 wt. % hexamethylenediamine, 28.4 wt. % terephthalic acid, 12.2 wt. % isophthalic acid, 0.83% acetic acid, 0.082 wt. % sodium hypophosphite and 27 wt. % distilled water. The product resin was solid state polymerized in a Rotary Vacuum Oven at 215° C. The product resin exhibited a melting point of 319° C.

Preparation of the Polyamide Used in Composition E6, PA6T/6I/10T/10I with Repeat Unit Mole Ratio of Hexamethylene Terephthalamide, Hexamethylene Isophthalamide, Decamethylene Terephthalamide and Decamethylene Isophthalamide of 62.5:2.5:32.5:2.5

The polyamide component in E10 was produced according to the procedure described above but using the ingredients in the following quantities: 31,237 g hexamethylenediamine, 23,158 g 1,10-decanediamine, 59,089 g terephthalic acid, 3,110 g isophthalic acid, 1,153 g acetic acid, 138.7 g sodium hypophosphite and 69,431 g distilled water. The product resin exhibited a melting temperature of 319° C.

Preparation of the Polyamide Used in Composition CE3, PA10T/6T with Repeat Unit Mole Ratio of Decamethylene Terephthalamide and Hexamethylene Terephthalamide of 50:50

Polyamide component in CE3 was produced according to the procedure described above but using the ingredients in the following quantities: 10,799 g hexamethylenediamine, 15,853 g 1,10-diaminodecane, 30,568 g terephthalic acid, 69.1 g sodium hypophosphite and 38,414 g distilled water. The product resin exhibited a melting temperature of 309° C.

Compounding

The following commercially available materials were used:

Reinforcing Fillers:
Wollastonite: Vansil® HR-1500 available from RT Vanderbilt—9μ median particle size—14:1 aspect ratio (as specified by supplier)
Glass fiber-1: Chopvantage® HP3540 glass fibers from PPG industries
Glass fiber-2: Performax LC807A
Glass fiber-3: OCV 995 from OCV™ Reinforcements Titanium Dioxide:
TiO$_2$-1: Ti-Pure® R-105 available from DuPont Titanium Technologies—rutile TiO$_2$ manufactured by chloride process, treated with silica and alumina.
TiO$_2$-2: Tipaque PC-3 available from Ishihara Sangyo Kaisha, Ltd—rutile TiO$_2$ manufactured by chloride process, treated with silica and alumina.

Magnesium Oxide:
MgO: Kyowamag MF-150 available from Mitsui Plastics Inc.

Stabilizers and Additives:
Stab-1: ULTRANOX® 626 stabilizer is (2,4-di-t-butylphenyl)pentaerythritol diphosphite commercially available from Chemtura.
Stab-2: NYLOSTAB® SEED stabilizer is a hindered amine available from Clariant Corp.
Stab-3: ADK AO-80 hindered phenol available from Amfine.
Talc: Imi-Fabi HTP-4 available from Imi Fabi L.L.C.
LLDPE: LLDPE GRSN-9820 NT 7 commercially available from DOW.

General Procedure for the Preparation of the Compositions

The polyamide resins described above were fed to the first barrel of a ZSK-26 twin screw extruder comprising 12 zones via a loss in weight feeder. The barrel settings were in the range of 280-330° C. and the resins were melted before zone 5. The other ingredients were fed at zone 5 through a side stuffer via a loss in weight feeder. The screw rate was 250 rpm. The extrudates were cooled and pelletized using conventional equipment. The results are summarized in Table 1, indicating each of the resins used, and the amount of each ingredient given in weight %.

Melting Temperature Measurements on the Compositions

Melting temperatures of the different compounds were measured according to ISO 11357-3 using a TA Instruments Model Q20 Differential Scanning calorimeter and Liquid Nitrogen Cooling System operated with TA Thermal Advantage and Universal Analysis software. The instrument was calibrated using a heating and cooling rate of 20° C./min in nitrogen atmosphere. The measurements were also carried out using a heating and cooling rate of 20° C./min in nitrogen atmosphere. Resin melting temperature was determined from the second heating scan peak value.

Intrinsic Melt Viscosity Measurements

The intrinsic melt viscosity of the prepared compositions were measured according to ASTM D 3835-08 method and using a capillary rheometer LCR7000 with the following testing conditions: the sample used had a weight of about 30 g; the die orifice length was of 15.240 mm±0.025 mm, and the die orifice diameter was of 1.016 mm±0.008 mm; the sample was preconditioned with a drying step of at least 24 hours at 80° C. under vacuum of approximately 28" Hg leading to low moisture content. The intrinsic melt viscosity measurements were carried out on samples having a moisture content ranging from 150-500 ppm; The rheometer was heated at a specific temperature chosen from the temperature range defined by [(Tm max)+10° C.] to [(Tm max)+20° C.], where (Tm max) is the highest melting temperature of all melting temperatures of the compositions determined as described above. The sample was held for 100 s and then the piston was moved at rates of 100 $s^{-1}$, 400 $s^{-1}$, 1000 $s^{-1}$, 2500 $s^{-1}$ and 5000 $s^{-1}$. Intrinsic melt viscosity in Pascal seconds, Pa·s, was calculated for each shear rate according to the method. Results are shown for the intrinsic melt viscosity measured at 400 $s^{-1}$.

Moisture Content Measurements

The moisture content of the polyamides were measured following ASTM D6869-03 method and using about 0.5-0.7 g of the polyamide as a sample and an oven temperature of about 245° C. with a Mitsubishi CA/VA-100 moisture analyzer. All samples had from 150-500 ppm of moisture content when the intrinsic melt viscosity measurements were carried out.

Reflectance Measurements

The LED assembly manufacturing process featuring a specific thermal treatment (10 min at 260° C., 8 hours at 160° C.) can be simulated by exposing samples at 260° C. for 10 minutes.

Therefore, each one of the compositions of examples 1-10 and comparative examples CE1-CE3 were used to prepare discs of about 50 mm diameter with a thickness of about 1.6 mm.

Percentage retention of reflectivity at a wavelength of 450 nm with discs as moulded and when disc were heated in air at 260° C. for 10 min is also given in Table 2. Reflectance was measured with BKY-Gardner photo-spectrometer.

Results

As it can be seen from the results shown in Table 2, the compositions of the present invention surprisingly show higher retention of reflectivity after exposure to air at 260° C. for 10 min compared to comparative compositions.

The data summarized in Table 2 here below well demonstrate the synergy between metal oxide such as magnesium oxide and polyamides featuring low intrinsic melt viscosities, it is advantageously possible to achieve outstanding optical properties both on the moulded article as such and after thermal treatment, intended to mimic conditions which the materials might be exposed during processing for e.g. manufacturing elements to be incorporated in LED apparatuses.

Comparative examples CE-1 and CE-2 provide evidence of the criticality of the presence of a metal oxide: the sole presence of polyamide 9T, even if featuring low intrinsic melt viscosities (about 219 Pa·s, i.e. low enough to be within the claimed range), is not effective in providing the outstanding optical properties obtained with the examples according to the invention; actually despite high values of reflectance on moulded specimen as such, thermal treatment has a tremendous detrimental effect on said optical properties.

Comparative examples CE-2 and example E1 differ only by the fact that 0.9 wt. % of Stab-1 (ULTRANOX® 626 stabilizer) has been replaced weight by weight by magnesium oxide. This results in a small variation in the initial reflectance but in a considerable difference in the reflectance results obtained after the harsh heat treatment.

Comparative example CE3 featuring a high intrinsic melt viscosity, even if comprising a high amount of magnesium oxide has provided evidence that with such polyamides, even via addition of optical brightener, stabilizers and processing additive, optical properties are not maintained after the thermal treatment, notwithstanding the fact that above mentioned additives are well known for improving reflectance and minimizing thermal degradation.

Compositions according to the present invention (E1-E10) all comply with a wide set of requirements as set forth previously (notably good processability, high dimensional stability, high mechanical strength) and also surprisingly feature a reflectance after heat treatment of at least 81%. Those compositions are therefore excellent candidates for the manufacture of LED components.

Should the disclosure of any patents, patent applications, and publications which are incorporated herein by reference conflict with the description of the present application to the extent that it may render a term unclear, the present description shall take precedence.

TABLE 1

List of ingredients of the prepared compositions

| | CE1 | CE2 | CE3 | E1 | E2 | E3 | E4 | E5 | E6 | E7 | E8 | E9 | E10 |
|---|---|---|---|---|---|---|---|---|---|---|---|---|---|
| PA9T | 58 | 55.9 | | 55.9 | | | | | | | | | |
| PA 6T/10T (50/50) (1) | | | 51.0 | | | | | | | | | | |
| PA10T (1) | | | | | 51.15 | | | | | | | | |
| PA10T (2) | | | | | | 51.15 | | | | | | | |
| PA10T/11 (90/10) | | | | | | | 51.15 | | | | | | |
| PA 10T/6T (85/15) | | | | | | | | 51.15 | | | | | |
| PA 6T/10T (50/50) (2) | | | | | | | | | 51.15 | | | | |
| PA 10T/10, NDA (90/10) | | | | | | | | | | 51.15 | | | |

TABLE 1-continued

List of ingredients of the prepared compositions

| | CE1 | CE2 | CE3 | E1 | E2 | E3 | E4 | E5 | E6 | E7 | E8 | E9 | E10 |
|---|---|---|---|---|---|---|---|---|---|---|---|---|---|
| PA 6T/6I (70/30) | | | | | | | | | | | 51.15 | 53.15 | |
| PA 6T/6I/10T/10I (62.5/2.5/32.5/2.5) | | | | | | | | | | | | | 51 |
| Wollastonite | | | | | 22 | 22 | 22 | 22 | 22 | 22 | 20 | | |
| Glass fiber-1 | 22 | 22 | | 22 | | | | | | | | | |
| Glass fiber-2 | | | 22 | | | | | | | | | 20 | |
| Glass fiber-3 | | | | | | | | | | | | | 22 |
| TiO2-1 | | | 20 | | 20 | 20 | 20 | 20 | 20 | 20 | 20 | 20 | |
| TiO2-2 | 20 | 20 | | 20 | | | | | | | | | 20 |
| MgO | | | 5 | 0.9 | 5 | 5 | 5 | 5 | 5 | 5 | 5 | 5 | 5 |
| Stab-1 | | 0.9 | | | | | | | | | | | |
| Stab-2 | | 0.6 | 0.3 | 0.6 | 0.3 | 0.3 | 0.3 | 0.3 | 0.3 | 0.3 | 0.3 | 0.3 | 0.3 |
| Stab-3 | | 0.6 | 0.4 | 0.6 | 0.3 | 0.3 | 0.3 | 0.3 | 0.3 | 0.3 | 0.3 | 0.3 | 0.4 |
| Talc | | | 1 | | 1 | 1 | 1 | 1 | 1 | 1 | 1 | 1 | 1 |
| LLDPE | | | 0.3 | | 0.25 | 0.25 | 0.25 | 0.25 | 0.25 | 0.25 | 0.25 | 0.25 | 0.3 |

TABLE 2

Intrinsic melt viscosity and reflectance measurements

| | CE1 | CE2 | CE3 | E1 | E2 | E3 | E4 | E5 | E6 | E7 | E8 | E9 | E10 |
|---|---|---|---|---|---|---|---|---|---|---|---|---|---|
| Melting temperature Tm (° C.) | 295/307 | 295/307 | 309 | 295/307 | 316 | 318 | 292 | 295 | 316 | 297/308 | 319 | 319 | 319 |
| Intrinsic melt viscosity of the compound, (Pa · s) measured at 400/s | 218.5 | 220.6 | 1097.7 | 224.2 | 375.0 | 76.4 | 142.0 | 191.1 | 127.0 | 169.4 | 345.9 | 325.9 | 506.9 |
| Temperature at which intrinsic melt viscosity was measured (° C.) | 320 | 320 | 325 | 320 | 335 | 335 | 310 | 310 | 335 | 320 | 335 | 335 | 330 |
| Reflectance as molded | 92 | 90.3 | 89.8 | 90.9 | 91.8 | 92.1 | 91.5 | 91.7 | 92.4 | 91.5 | 92.5 | 92.1 | 92.3 |
| Reflectance after 10 minutes at 260° C. | 62.2 | 73.6 | 73.5 | 83.8 | 81.0 | 87.0 | 86.7 | 83.8 | 86.1 | 85.2 | 81.7 | 80.9 | 83.9 |

The invention claimed is:

1. A composition having at least one melting temperature (Tm) as measured according to ISO 11357-3, said composition comprising:
at least one polyamide;
at least one metal oxide selected from magnesium oxide, zinc oxide, calcium oxide and mixtures thereof; and
titanium dioxide;
wherein the composition has an intrinsic melt viscosity of below 800.0 Pa·s as measured according to ASTM D3835-08 at a moisture content as measured according to ASTM D6869-03 in the range of 150-500 ppm at a shear rate of 400 s$^{-1}$ and at a temperature ranging from [(Tm max)+10° C.] to [(Tm max)+20° C.], where (Tm max) is the highest of all melting temperatures (Tm).

2. The composition according to claim 1, wherein the weight percent of the polyamide in the total weight of the composition is of at least 30 wt. %.

3. The composition according to claim 1, wherein the composition further comprises a reinforcing filler.

4. The composition according to claim 3, wherein the reinforcing filler is selected from wollastonite and glass fiber.

5. The composition according to claim 3, wherein the weight percent of the reinforcing filler in the total weight of the composition is of at least 15 wt. %.

6. The composition according to claim 1, wherein the weight percent of the titanium dioxide in the total weight of the composition is of at least 6 wt. %.

7. The composition according to claim 1, wherein the at least one polyamide comprises recurring units deriving from the polycondensation reaction of at least one diamine selected from the group consisting of 1,6-diaminohexane, 1,8-diamino-octane, 1,9-diaminononane, 1,10-diaminodecane, 1,11-diaminoundecane, 1,12-diaminododecane and meta-xylylene diamine and at least one dicarboxylic acid selected from the group consisting of phthalic acids, adipic acid, naphtalenedicarboxylic acids, sebacic acid and azelaic acid.

8. The composition according to claim 1, wherein the weight percent of the metal oxide in the total weight of the composition is of at most 8 wt. %.

9. The composition according to claim 8, wherein the weight percent of the metal oxide in the total weight of the composition is of at least 2 wt. %.

10. The composition according to claim 1, wherein the metal oxide is magnesium oxide.

11. An article comprising at least one component comprising the polyamide composition according to claim 1.

12. The article of claim 11 wherein said article is a light emission apparatus.

13. The light emission apparatus according to claim 12, wherein said apparatus is a LED.

14. A method for making a light emission apparatus comprising heating components of the apparatus, at least one component comprising the polyamide composition according to claim 1.

15. The method of claim 14, wherein the heating is a result of the performance of a soldering operation, or wherein the apparatus further comprises an epoxy or silicone encapsulant and the heating is conducted to cure the encapsulant.

16. The composition according to claim 1, wherein the composition has a higher retention of reflectivity after exposure to air at 260° C. for 10 minutes, as compared to compositions not comprising the combination of the at least one polyamide, the at least one metal oxide, titanium dioxide, and the intrinsic melt viscosity.

17. The composition according to claim 1 further comprising at least one end capping agent selected from the group consisting of an acid having only one reactive carboxylic acid group, and amine having only one reactive amine group, and mixtures thereof.

18. The composition according to claim 17, wherein the end capping agent is selected from the group consisting of acetic acid, propionic acid, butyric acid, valeric acid, caproic acid, caprylic acid, lauric acid, stearic acid, cyclohexanecarboxylic acid, benzoic acid, methylamine, ethylamine, butylamine, octylamine, aniline, toluidine, propylamine, hexylamine, dimethylamine, cyclohexylamine, and mixtures thereof.

19. The composition according to claim 17 comprising 0.1 to 6.5 mol. % of the end capping agent.

20. The composition according to claim 17 comprising 1 to 5.5 mol. % of the end capping agent.

21. A composition having at least one melting temperature (Tm) as measured according to ISO 11357-3, said composition comprising, based on total weight of the composition:
    from 40 to 70 wt. % of at least one polyamide,
    from 3 to 7 wt. % magnesium oxide,
    from 10 to 40 wt. % of a reinforcing filler comprising wollastonite and/or glass fibers, and
    from 10 to 30 wt. % titanium dioxide,
wherein the composition has an intrinsic melt viscosity of below 800.0 Pa·s as measured according to ASTM D3835-08 at a moisture content as measured according to ASTM D6869-03 in the range of 150-500 ppm at a shear rate of 400 $s^{-1}$ and at a temperature ranging from [(Tm max)+10° C.] to [(Tm max)+20° C.], where (Tm max) is the highest of all melting temperatures (Tm).

22. A component for a light emission apparatus comprising a polyamide composition according to claim 21.

23. The component of claim 22, wherein the component is selected from a basic housing that acts as a reflector or a heatsink slug that acts as a reflector.

24. The component of claim 23, wherein the component exhibits a reflectance of at least 81% at a wavelength of 450 nanometers after exposure to air at 260° C. for 10 minutes.

25. The composition according to claim 21 further comprising at least one end capping agent selected from the group consisting of an acid having only one reactive carboxylic acid group, and amine having only one reactive amine group, and mixtures thereof.

26. The composition according to claim 25, wherein the end capping agent is selected from the group consisting of acetic acid, propionic acid, butyric acid, valeric acid, caproic acid, caprylic acid, lauric acid, stearic acid, cyclohexanecarboxylic acid, benzoic acid, methylamine, ethylamine, butylamine, octylamine, aniline, toluidine, propylamine, hexylamine, dimethylamine, cyclohexylamine, and mixtures thereof.

27. The composition according to claim 25 comprising 0.1 to 6.5 mol. % of the end capping agent.

28. The composition according to claim 25 comprising 1 to 5.5 mol. % of the end capping agent.

* * * * *